(12) United States Patent
Cote et al.

(10) Patent No.: US 7,820,481 B2
(45) Date of Patent: Oct. 26, 2010

(54) ROTARY CHIP ATTACH PROCESS

(75) Inventors: Andre Cote, Williamstown, NJ (US); Detlef Duschek, Sensbachtal (DE)

(73) Assignee: Checkpoint Systems, Inc., Thorofare, NJ (US)

( * ) Notice: Subject to any disclaimer, the term of this patent is extended or adjusted under 35 U.S.C. 154(b) by 0 days.

(21) Appl. No.: 12/500,373

(22) Filed: Jul. 9, 2009

(65) Prior Publication Data
US 2009/0269882 A1      Oct. 29, 2009

Related U.S. Application Data

(62) Division of application No. 11/560,692, filed on Nov. 16, 2006, now Pat. No. 7,569,932.

(51) Int. Cl.
*H01L 21/44* (2006.01)
*H01L 21/48* (2006.01)
*H01L 21/50* (2006.01)

(52) U.S. Cl. .................... 438/107; 438/109; 438/464; 257/723; 257/731

(58) Field of Classification Search .............. 438/107, 438/109, 110, 464; 29/426.3, 426.4, 834; 257/723, 731
See application file for complete search history.

(56) References Cited

U.S. PATENT DOCUMENTS

| | | | |
|---|---|---|---|
| 4,915,565 A | 4/1990 | Bond et al. | |
| 5,153,983 A | 10/1992 | Oyama | |
| 5,362,681 A * | 11/1994 | Roberts et al. | 438/464 |
| 5,399,505 A | 3/1995 | Dasse et al. | |
| 5,671,530 A * | 9/1997 | Combs et al. | 29/834 |
| 5,708,419 A | 1/1998 | Isaacson et al. | |
| 6,185,815 B1 | 2/2001 | Schindler | |
| 6,247,226 B1 | 6/2001 | Lundberg et al. | |
| 6,951,596 B2 | 10/2005 | Green et al. | |
| 7,363,102 B2 | 4/2008 | Yong et al. | |
| 2004/0154161 A1 | 8/2004 | Aoyama et al. | |
| 2007/0198860 A1 | 8/2007 | Haug | |
| 2007/0251449 A1 | 11/2007 | Mizuno et al. | |

FOREIGN PATENT DOCUMENTS

| | | |
|---|---|---|
| DE | 10214347 A1 | 9/2003 |
| EP | 1159861 B1 | 12/2001 |
| WO | 2004/064124 | 7/2004 |

* cited by examiner

*Primary Examiner*—Phuc T Dang
(74) *Attorney, Agent, or Firm*—Caesar, Rivise, Bernstein, Cohen & Pokotilow, Ltd.

(57) ABSTRACT

A rotary chip attach process and manufacturing approach takes chips (e.g., integrated circuits (ICs)) from a wafer in a rotary process. A chip wafer with a positioning unit is placed over the top of a sprocketed wheel that picks the ICs directly from the wafer and moves them in a semi-continuous in-step motion to a web that will accept the ICs. The sprocketed wheel includes chips that are preferably the same type as used in a typical pick-and-place robotic system, with vacuum heads adapted to pierce the wafer flat membrane (if needed), grab and IC and place and IC as desired. This positioning system keeps the IC's placement in an accurate position on the web, which can be made to move continuously with a plurality of sprocketed wheel placement units in place.

11 Claims, 4 Drawing Sheets

ROTARY CHIP ATTACH PROCESS

CROSS-REFERENCE TO RELATED APPLICATIONS

This application is a divisional application of application Ser. No. 11/560,692 filed on Nov. 16, 2006 U.S. Pat. No. 7,569,932 entitled ROTARY CHIP ATTACH, and whose entire disclosure is incorporated by reference herein.

BACKGROUND OF THE INVENTION

1. Field of Invention

This invention is related to communication devices, and in particular, to the manufacture of security tags often use, for example, as Radio Frequency Identification (RFID) circuits.

2. Description of Related Art

Chip bonding is costly. The two largest components of the cost of RFID tags today are the integrated circuit and the attachment of that circuit (otherwise known as silicon) to an antenna structure. While the increasing volume of the number of chips helps to drive the IC cost down, bonding is a mechanical process and does not benefit from the same technology advances or economic scale.

Current methods of chip bonding do not adequately address costs. A two-step approach of an intermediary chip strap achieves incremental costs improvement by relocating the costs. However, straps do not address the problem directly, as bonding is still required, but to a smaller tag. Moreover, straps add another step to bond the strap to the antenna structure. Current manufacturers, using standard bonding technology with straps, want straps to be like traditional bonding surfaces, as commonly found on circuit board technology that is, hard and inflexible. However, such straps do not lend themselves to easy integration into flexible tags (e.g., RFID tags). The standard bonding processes are all known strap-based solutions, and therefore less than ideal.

One related art attachment method, called Fluidic Self Assembly (FSA), provides insufficiently robust bonds. Because the chips find their own way into bonding sockets, the chips cannot use adhesives or flux, since anything sticky prevents free motion of the chips into the sockets. With the fluid self assembly process, the bond is made at a tangent between the chip bonding pad and sides of the bonding cavity. This flat-to-edge bond is different than and less reliable than traditional bonds, which are made flat-to-flat. Fluidic self assembly also places restrictions on the type of substrate that can be used. Fluidic Self Assembly (FSA) does not create the bond, it only places tags into appropriate carrier for attachment. Current FSA method being practiced uses patterned cut out polyester and laminates another film on top of the web with chips in place. The back web then is laser cut leaving a hole in direct proximity and above the chip bonding pad area. This hole is filled with conductive ink and a trace is completed on the back side perpendicular to the hole creating a strap. The FSA process is slow and uses multiple steps and requires a high degree of accuracy with known technology products available today.

A known wire bonding process is disclosed in U.S. Pat. No. 5,708,419 to Isaacson, et al., the contents of which are incorporated by reference herein in its entirety. Isaacson discusses the bonding of an Integrated Circuit (IC) to a flexible or non-rigid substrate which generally can not be subjected to high temperatures, such as the temperature required for performing soldering processes. In this wire bonding process, a chip or dye is attached to a substrate or carrier with conductive wires. The chip is attached to the substrate with the chip front-side face up. Conductive wires are bonded first to the chip, then looped and bound to the substrate. The steps of a typical wire bonding process include:

1. advancing web to the next bond site;
2. stopping;
3. taking a digital photograph of the bond site;
4. computing bond location;
5. picking up a chip;
6. moving the chip to the bond site;
7. using photo feedback to adjust placement to the actual site location;
8. placing or depositing chip;
9. photographing the chip to locate the bond pads;
10. moving the head to the chip bond pad;
11. pressing down, vibrating and welding conductive wire to the bond pad;
12. pulling up and moving the chip to the substrate bond pad, trailing wire back to the chip bond
13. pressing down and welding that bond;
14. pulling up and cutting off the wire; and
15. repeating steps 10-14 for each connection.

In contrast, the interconnection between the chip and substrate in flip-chip packaging is made through conductive bumps of solder that are placed directly on the chip's surface. The bumped chip is then flipped over and placed face down, with the bumps electrically connecting to the substrate.

Flip chip bonding, a current state of the art process, is expensive because of the need to match each chip to a tiny, precision-cut bonding site. As chips get smaller, it becomes even harder to precisely cut and prepare the bonding site. However, the flip-chip bonding process is a considerable advancement over wire bonding. The steps of a typical flip-chip bonding process include:

1. advancing web to the next bond site;
2. stopping;
3. photographing the bond site;
4. computing the bond location;
5. picking up the chip;
6. moving the chip to the bond site;
7. using photo feedback to adjust placement at the actual site location;
8. placing the chip;
9. ultrasonically vibrating the placement head to weld chip in place; and
10. retracting the placement head.

Steps 1 through 8 of each of the above bonding processes are substantially the same. The web must stop to locate the conductive gap in the substrate and precisely place the IC. The related art processes require that the web is stopped and measured (e.g., photographing the bond site, containing the bond location, using photo feedback to adjust placement at the actual site location) so that the chip can be accurately placed as desired adjacent the gap and bonded.

An approach has been made to improve on the flip chip bonding process by using a multiple head pick-and-place system. However, this approach created other problems, such as it is very difficult to align all of the multiple heads to individually pick up and place the chips. That is, using a multiple head pick-and-place system, it was hard to consistently pick up and set all of the chips accurately.

During step 5 of the above bonding processes, the chip is picked up, typically from a chip wafer (e.g., semiconductor wafer) or intermediate structure holding the chips after they have been formed as a plurality of integrated circuits on the chip wafer. Generally, each chip wafer has dozens to hundreds of individual chips or dice formed thereon. As integration geometries decrease and the size of chip wafers increase, the number of integrated circuit dice formed on each wafer also increases. Once the chips or dice are formed on the chip wafer, the chips are tested to determine which chips are functional and which chips are not functional. In most testing procedures, each chip or die is probed using very costly probe equipment while the chips/dice are still in wafer form, typically by contacting each bonding pad on each individual chip with a separate probe needle. That is, while the chips are still in wafer form, each chip is probed in order to determine whether each chip passes a test for electrical opens or shorts. Preferably, a full functionality test and thorough reliability test are also provided for the probed chips. The purpose of the wafer level chip tests is to determine, as early as possible in the manufacturing process, which chips are defective. The earlier a defective chip is detected, the less money that is wasted on further processing of the defective chip.

FIG. 1 illustrates a chip wafer 10 (e.g., semiconductor wafer) in accordance with the prior art. The chip wafer 10 includes a wafer flat 12 having a plurality of chips 14 (e.g., integrated circuits, dice) which are formed thereon. The chips 14 are arranged in an array of rows and columns which are separated by a plurality of dicing lanes, such as horizontal dicing lanes 16 and vertical dicing lanes 18. In a typical chip wafer, about 50% to 75% of chips are good and about 25% to 50% of the chips are bad, that is, defective. The good or bad chips are marked in accordance with results of the wafer level chip tests. A known vision system maps the good chips, which enables single head pick-and-place systems to select and move only the mapped good chips. Unfortunately, the known multi-head pick-and-place systems have not been successful in selecting and placing only the good chips. Instead, these systems typically grab all of the chips, as it is difficult to align all of the multiple heads to only take the good chips from the wafer. It would thus be a benefit to selectively take only the good chips directly from the wafer, preferably in a rotary process. All references cited herein are incorporated herein by reference in their entireties.

Retracing a path during the bonding process takes time, causes vibration, and wears mechanical linkages. These linkages also create uncertainty in absolute position. Rotating or continuous devices are preferred over reciprocating devices, in part because stopping and starting the manufacturing line always slows the process down and reduces throughput. It would be beneficial to adjust tooling to operate in a process that is continuously advancing down the line.

BRIEF SUMMARY OF THE INVENTION

The preferred embodiments include a rotary chip attach process and manufacturing approach that takes chips (e.g., integrated circuits (ICs)) from a wafer in a rotary process. A chip wafer with a positioning unit is placed over the top of a sprocketed wheel that picks the ICs directly from the wafer and moves them in a semi-continuous motion to a web that will accept the ICs. The sprocketed wheel includes tips that are preferably the same type as used in a typical pick-and-place robotic system, with vacuum heads adapted to pierce the wafer flat membrane, grab and IC and place and IC as desired. This positioning system keeps the IC's placement in an accurate position on the web, which can be made to move faster or continuously with a plurality of wheel positioning systems in place.

A preferred embodiment of the invention includes a method for transferring predetermined ICs (e.g., transponders, chips, dice) from a wafer bed to a substrate moving in a first direction. The method includes selecting one of the ICs, aligning the selected IC with a rotary unit having pick up members externally placed about the rotary unit, continuously rotating the rotating unit (e.g., in-step) between the wafer bed and the substrate, taking the selected IC from the wafer bed with one of the pick up members, moving the selected IC about the rotary unit (e.g., in-step) to the moving substrate, and placing the selected IC on the substrate moving in the first direction. The method may also include mapping the ICs on the wafer bed as either desired ICs or unwanted ICs, and selecting one from the group of desired ICs. The method may further include continuously moving the substrate while placing the selected IC on the substrate. Moreover, the method may include selecting a plurality of ICs, aligning the selected ICs with the rotary unit, taking the selected ICs from the wafer bed with a respective one of the plurality of pick up members, and placing the selected ICs on the substrate adjacent a previously placed selected IC.

The preferred embodiments of the invention also include a method for transferring predetermined ICs from first and second wafer beds to a substrate moving in a first direction. The method includes mapping ICs on both the first and second wafer beds as desired ICs or unwanted ICs, selecting a desired IC from each of the wafer beds, aligning the selected IC from the first wafer bed with a first rotary unit having pick up members externally placed about the first rotary unit, aligning the selected IC from the second wafer bed with a second rotary unit having pick up members externally placed about the second rotary unit, continuously rotating the first rotating unit in-step between the first wafer bed and the substrate, continuously rotating the second rotating unit in-step between the second wafer bed and the substrate, taking the selected IC from the first wafer bed with one of the pick up members from the first rotary unit, taking the selected IC from the second wafer bed with one of the pick up members from the second rotary unit, moving the selected IC from the first wafer bed about the first rotary unit to the moving substrate, moving the selected IC from the second wafer bed about the second rotary unit to the moving substrate, placing the selected IC from the first wafer bed on the substrate moving in the first direction, and placing the selected IC from the second wafer bed on the substrate adjacent and in alignment with the selected IC from the first wafer bed. The method may also include continuously moving the substrate in the first direction while the selected ICs are placed on the substrate.

According to one of the preferred embodiments, the invention further includes a device for transferring predetermined ICs from a wafer bed to a substrate moving in a first direction. The device includes a wafer bed having a plurality of ICs marked as desired ICs or unwanted ICs, the substrate generally below the wafer bed and moving in a first direction; and a rotary unit rotating in a stepping motion between the wafer bed and the substrate. The rotary unit includes pick up members spread about the periphery of the rotary unit with each of the pick up members adapt to pick up a respective desired IC, holding the respective desired IC while the rotary unit rotates, and release the respective desired IC on the substrate moving in the first direction. In addition, the device may include a second wafer bed having a plurality of ICs marked as desired ICs or unwanted ICs, and a second rotary unit rotating in a stepping motion between the second wafer bed and the substrate, with the second rotary unit including pick up members spread about the periphery of the second rotary unit. Each of the pick up members is adapted to pick up a respective desired IC, hold the respective desired IC while the second rotary unit rotates, and release the respective desired IC on the substrate adjacent the respective desired IC released by the first rotary unit.

BRIEF DESCRIPTION OF SEVERAL VIEWS OF THE DRAWINGS

The invention will be described in conjunction with the following drawings in which like reference numerals designate like elements, and wherein.

DETAILED DESCRIPTION OF THE PREFERRED EMBODIMENTS

This invention discloses a rotary process and device for the movement of ICs from a wafer to a substrate. Typically, larger ICs are manipulated using pick-and-place robotic systems with chips shooters moving the ICs during board manufacturing. The inventors of the preferred embodiments have discovered a new process and device having a positioning unit that directly places a wafer bed over a sprocketed wheel. The sprocketed wheel picks the ICs directly from the wafer and moves the ICs—preferably in a continuous in-step motion—to a web or substrate that accepts the ICs. The sprocketed wheel preferably moves in a single vertical plane, which allows for accurate positioning of the ICs on the web. The web or substrate can be made to move continuously, preferably when integrated with a plurality of sprocketed wheels working together in alignment to alternatively place the chips on the substrate in close proximity for increased throughput.

Figure 2:
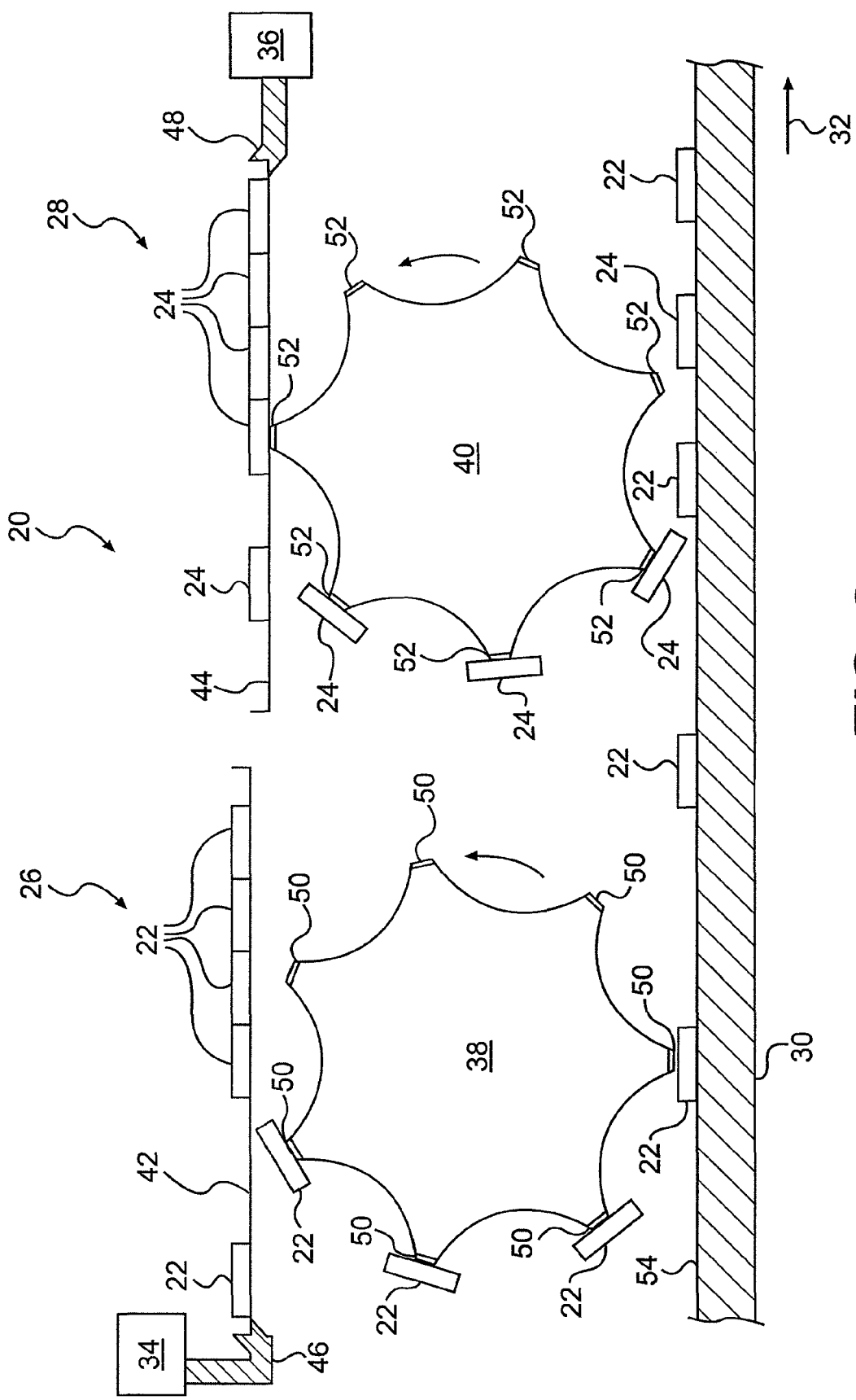
FIG. 2 is a sectional side view of the rotary chip attach device in accordance with the first preferred embodiment of the invention.

An example of the preferred embodiments for a rotary chip attach approach is shown in FIG. 2. According to FIG. 2, a rotary chip attach station 20 transfers ICs from wafers to a web in a rotary process. In particular, the rotary chip attach station 20 transfers chips 22, 24 from IC wafer beds 26, 28, respectively, to a substrate 30 moving continuously in a machine direction 32. As such, the rotary chip attach station 20 preferably includes the first IC wafer 26, the second IC wafer 28, a first positioning unit 34, a second positioning unit 36, a first rotary unit 38, a second rotary unit 40, and the substrate 30.

Figure 1:
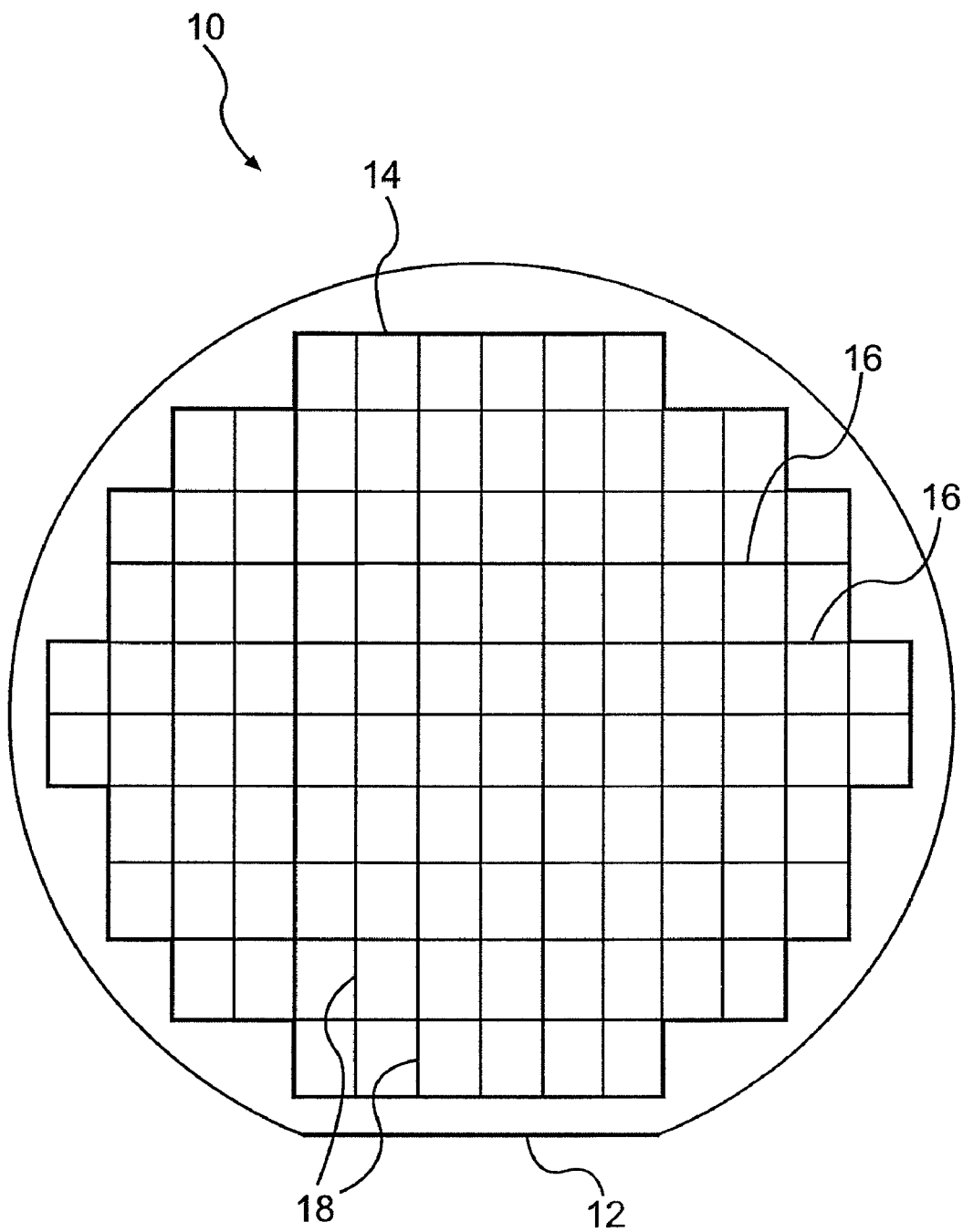
FIG. 1 is a top view of an IC wafer in accordance with prior art.

The first IC wafer 26 includes a membrane 42 that supports the plurality of chips 22 formed thereon. While not being limited to a particular theory, the chips 22 are arranged as an array in a plurality of rows and columns as discussed above in FIG. 1. The positioning unit 34 includes a support member 46 that holds and moves the IC wafer 26 horizontally in the plane of the membrane 42 and vertically if needed. In particular, the positioning unit 34 can move the IC wafer 26 in an X-direction (e.g., the direction of the rows of chips), in the y-direction (e.g., the direction of the columns of chips), and, if needed, in the Z-direction (e.g., vertically up and down) for engagement with the first rotary unit 38, as will be described in greater detail below.

In the exemplary embodiment shown in FIG. 2, the positioning unit 34 also moves the first IC wafer in the vertical or Z-axis direction. That is, the support member 46 lifts and drops the IC wafer 26 up and down, into and out of communication with the first rotary unit 38. As such, the support member 46 is attached to the first IC wafer 26 and moves the first IC wafer above the first rotary unit 38 so that the chips 22 align with the pick-and-place heads (hereinafter also referred to as "heads" 50) (e.g., tips) of the first rotary unit.

While not being limited to a particular theory, the chips 22 on the first IC wafer 26 are tested to determine which of the chips are good and which chips are bad using an approach well known in the art. The determined results are stored in a computer (not shown) in communication with the positioning unit 34 (and also with the positioning unit 36). Based on the knowledge of which chips are good or bad, the positioning unit 34 is adapted to move the first IC wafer 26 with the support member 46 into alignment with the pick-and-place heads 50 of the first rotary unit 38, preferably with the help of known vision systems, so that only the good chips are picked by the heads of the first rotary unit for placement onto the substrate 38. In order to transfer the chips 22 from the first IC wafer 26 to the substrate 30, the first rotary unit 38 includes a plurality of the heads 50 that are configured generally as pick-and-place heads known in the industry. The heads 50 are adapted to pierce the membrane 42 of the first IC wafer 26, pick up a respective chip 22 (preferably using suction to hold the chip) and place the respective chip 22 onto the substrate 30 by releasing the suction of the chip.

While not being limited to a particular theory, the first rotary unit 38 has a generally sprocketed wheel shape with each outer tip including one of the pick-and-place heads 50. As the first rotary unit 38 rotates, preferably in-step with the assistance of a step motor (not shown), the heads 50 grab the good chips 22 from the first IC wafer 26 and deposit the chips onto the substrate 30. Preferably, the first rotary unit 38 rotates in-step substantially in a first plan (e.g., vertical) with the first rotary unit stopping temporarily as each pick-and-place head 50 rotates in turn to a position at the top of its rotation where it is closest to the first IC wafer 26. As an example of a rotary unit positioned in a temporary stopped position, second rotary unit 40 is substantially identical to the first rotary unit 38. The second rotary unit 40 is a generally sprocket shaped wheel having pick-and-place heads 52 like the pick-and-place heeds 50 of the first rotary unit 38. The pick-and-place heads 52 are adapted to pierce the membrane 44 of the second IC wafer 28 and grab chips 24, one at a time, preferably using suction as is well known to a skilled artisan. The pick-and-place heads 52 then carry the picked chip 24 from the second IC wafer 28 to the substrate 30 as the second rotary unit 40 rotates in-step, and places the chips 24 onto the substrate 30, preferably by releasing their vacuumed hold of the chips. As noted above, the second rotary unit 40 is shown in a stopped position with one of the pick-and-place heads 52 adjacent a membrane 44 of the second IC wafer 28. While not being limited to a particular theory, the first and second rotary units 38, 40 rotate in-step because it is preferable to minimize rotational movement of the heads 50, 52 during chip pick up from the membranes 42, 44.

In the exemplary embodiment shown in FIG. 2, the positioning unit 36, preferably aided by a known vision system, aligns the chips 24, and most preferably the good chips 24, with the pick-and-place heads 52. The positioning unit 36 then lowers the second IC wafer 28 into communication with the respective pick-and-place head 52 adjacent the membrane 44 so that an adjacent pick-and-place head can grab one of the chips 24 and transport the chip around and onto the substrate 30. On a larger scale, as the rotary units 38, 40 continuously rotate in-step, stopping for an instant to pick up selected chips 22, 24 from their corresponding IC wafers 26, 28, the respective positioning unit 34, 36 holding the IC wafer positions the IC wafer so that each selected chip is in turn aligned with the respective pick-and-place head temporarily stopped in position adjacent the membrane 42, 44 of the IC wafer. The respective positioning unit 34, 36 lowers the IC wafer 26, 28 close to and preferably in contact with the respective pick-and-place head so that the pick-and-place head can pierce the membrane and grab the chip. After the pick-and-place head grabs the chip, the respective positioning unit 34, 36 lifts the respective IC wafer 26, 28 away from the respective rotary unit 38, 40, and the rotary unit continues its rotation to its next temporarily stopped position, whereupon the next pick-and-place head picks up the next selected chip. As this process continues, the rotary units continuously pick up chips from the wafer in-step and deposit the chips onto the continuously moving substrate 30, whereupon the pick-and-place heads release the chips and continue their stepped rotation to grab, transport and release another chip.

Still referring to FIG. 2, the first rotary unit 38 is shown during rotation between steps. In this position, one of the pick-and-place heads 50 is shown releasing its previously held chip 22 onto the substrate 30, preferably by releasing its suctional hold of the chip while the head 50 is moving in rotation. At this time, the first IC wafer 26 is shown in a lifted position above the first rotary unit 38. The first IC wafer 26 is lifted by the positioning unit 34 via the support member 46 away from the first rotary unit 38 so that the first IC wafer does not interfere with the picked chips 22 as the first rotary unit transports the chip from the first IC wafer. In other words, the first IC wafer 26 is lifted to clear the wafer from the rotational movement of the most recently picked chip 22. In this preferred example, the IC wafers 26, 28 are lowered to their respective rotary unit 38, 40 so that the pick-and-place heads 50, 52 can grab a chip, and then the IC wafers are lifted away from the rotary units so that the picked chips 22, 24 can be removed from their IC wafers without adversely bumping against adjacent chips or breaking the membrane 42, 44. The adverse bumping or breaking may cause damage to the adjacent chips, compromise the integrity of the membrane, or prematurely release the picked chip from its hold. After a chip 22, 24 is picked up by a sprocket pick-and-place head 50, 52, the positioning unit 34, 36 moves the respective IC wafer 26, 28 to a next good chip, preferably adjacent the recently picked chip, and the next sprocket pick-and-place head picks up the next good chip as the head continuously rotates in a stepping motion.

While not being limited to a particular theory, the first and second rotary units 38, 40 alternately placed their picked chips 22, 24 onto the substrate 30 as the substrate moves continuously along its machine direction 32. The exemplary embodiment shown in FIG. 2 uses a plurality of rotary units (e.g., two) in line to place chips onto the substrate so that more chips can be placed onto the substrate and the substrate does not have to stop or slow down based on the throughput of a single rotary unit. Since each rotary unit is continuously rotating in-step, each rotary unit is limited in its throughput by its rotational speed and intermitted stopping to pick up the chips from the IC wafers. In order for chips to be placed on the substrate 30 without large gaps between the chips placed by any one rotary unit, a plurality of rotary units are placed in line so that the second rotary unit 40 (and additional similar rotary units, if desired) can place chips from additional IC wafers onto the substrate between previously placed chips to increase the number of chips that can be placed on the continuously moving substrate 30. Preferably, the chips are transferred from the respective rotary unit to the substrate while the rotary unit is moving (e.g., between its intermittent stops) so that the placed chip is moving at a speed close to the speed of the moving substrate 30. In this manner, the chips can be placed on the substrate without the chips sliding around on the substrate since the chips are already moving at the speed of a substrate as they are deposited onto the substrate. As noted above, the tips of the sprockets, that is, the pick-and-place heads 50, 52 are preferably of the type used in a typical pick-and-place system with vacuum heads. Preferably, each rotary unit has its own table or IC wafer. This allows each table to move independently for its respective rotary unit.

The exemplary embodiment in FIG. 2 shows two IC wafers 26, 28 that move in the X and Y directions to align its chips with each respective rotary unit, and that also move vertically in the Z-direction onto and off of the sprocket to allow the sprocket to pierce the membrane of the IC wafer and grab a chip. In another exemplary embodiment, shown in FIG. 3, the IC wafers move in the X and Y directions in the same manner as discussed in relation to the exemplary embodiment shown in FIG. 2. However, the IC wafers shown in FIG. 3 do not need to move in the Z-direction. Instead, the rotary units are adapted to shift up and down in the Z-direction to grab desired chips, as set forth in greater detail below.

Figure 3:
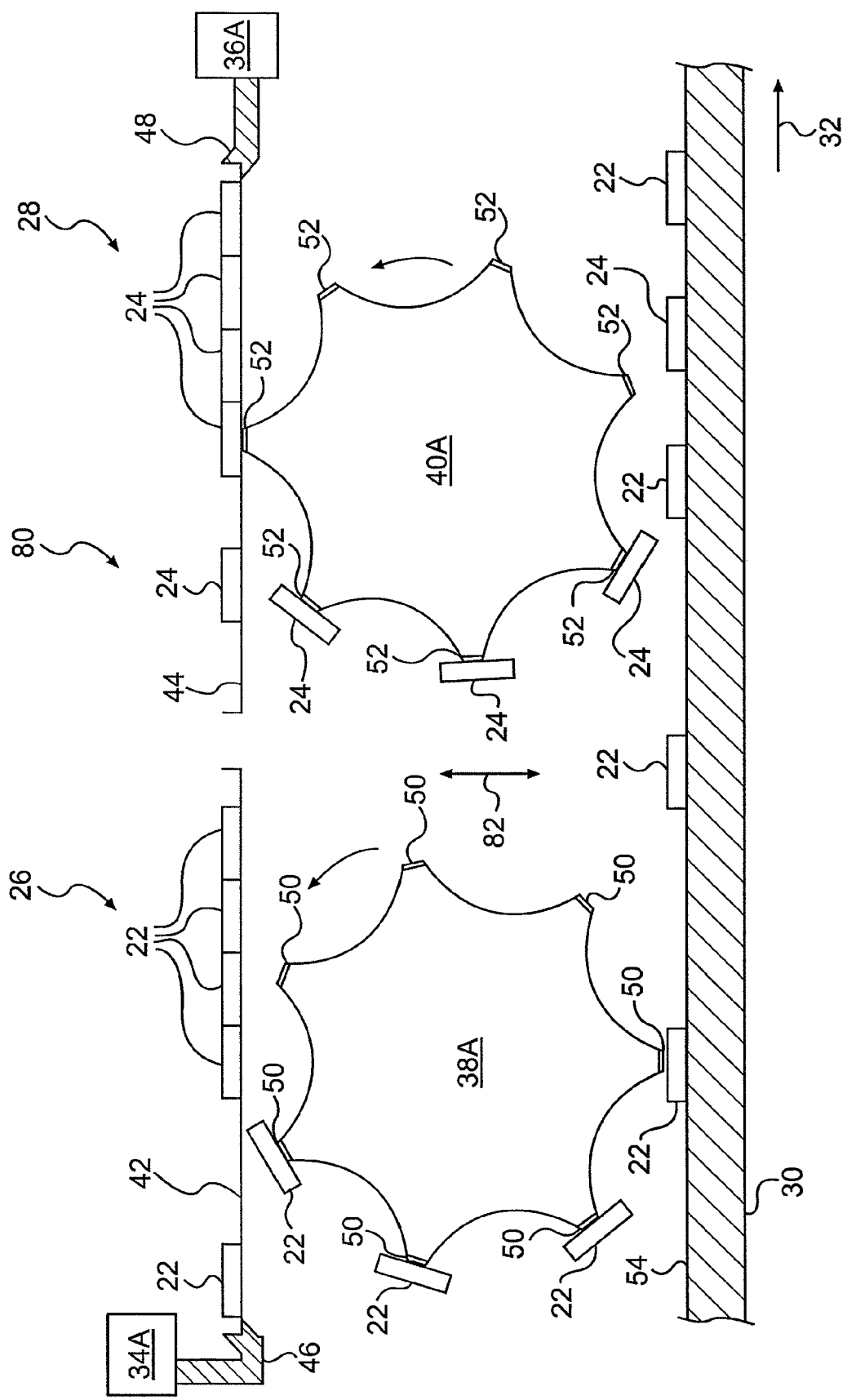
FIG. 3 is a side sectional side view of the rotary chip attach device in accordance with a second preferred embodiment of the invention.

FIG. 3 is a side view illustrating a rotary chip attach station 80 in accordance with an exemplary embodiment of the invention. The rotary chip attach station 80 is similar to the rotary chip attach station 20 illustrated if FIG. 2. For example, like the rotary chip attach station 20, the rotary chip attach station 80 shown in FIG. 3 includes a first rotary unit 38a, a second rotary unit 40A, a first positioning unit 34A and a second positioning unit 36A, all of which are substantially the same as the first rotary unit 38, the second rotary unit 40, and the positioning units 34, 36 shown in FIG. 2. The rotary chip attach station 80 of FIG. 3 also includes the first IC wafer 26, the second IC wafer 28 and the substrate 30 as shown and described above with reference to FIG. 2. The first and second positioning units 34A, 36A differ from the positioning units 34, 36 of FIG. 2 in that the first and second positioning units 34A, 36A do not need to raise or lower the IC wafers 26, 28 into attachment with the pick-and-place heads 50, 52 of the first and second rotary units 38A, 40A, respectively. Instead, the first rotary unit 38A and the second rotary unit 40A shift up and down in the Z-direction into engagement with the IC wafers. That is, while the first and second rotary units 38A, 40A rotate in-step—stopping temporarily at, for example, one-half second to one second intervals to pick chips 22, 24 from their IC wafers—the first and second rotary units 38A, 40A also move up and down in the Z axial direction 82. The first and second rotary units 38A, 40A shift up to pick the chips from the IC wafers 26, 28, and shift downwards toward the substrate 30 to pull the picked chips 22, 24 away from their respective IC wafer and drop the picked chips onto the substrate 30 that is moving continuously in the machine direction 32.

FIG. 3 shows the second rotary unit 40A temporarily stopped with one of the pick-and-place heads 52 adjacent the second IC wafer 28. In this position, the pick-and-place head 52 pierces the membrane 44 and grabs one of the chips, preferably using suction to pull the chip toward the pick-and-place head. The head 52 continues to hold the chip, preferably via suction, as the second rotary unit 40A rotates the head in-step toward the substrate 30 and releases its hold of the chip 24 as the chip is rotated adjacent to the substrate 30 (e.g., by cutting off its suction). As the rotary units 38A, 40A restart their rotation between stops, the rotary units shift or drop down away from the IC wafers 26, 28 in order to effectively remove the chips from their wafer without damaging the other chips, damaging the membrane 42, 44, or prematurely bumping the picked chip from its hold. Preferably the rotary units shift away from their respective IC wafer into close proximity with the substrate 30, which allows the rotary units to precisely place their picked chips onto the moving substrate.

While not being limited to a particular theory, the rotary units 38, 40, 38A, 40A are typically attached to a step motor via an axial shaft. In order to shift (e.g., lift, drop) the rotary units 38A, 40A, a mechanical lifter (e.g., arm, motor, etc.) as well understood by a skilled artisan acts upon the axial shaft to raise and lower the shaft in coordination with the rotational locations of the heads 50, 52 so that the rotary unit 38A, 40A is closest to the respective IC wafer 26, 28 when a pick-and-place head is facing the membrane 42, 44 to grab a desired chip 22, 24, and farthest from the respective IC wafer when the rotary unit is rotating to place a held chip onto the substrate 30. The mechanical lifter is at least part of an exemplary shifting means for raising and lowering the rotary units 38A, 40A.

Since the first and second rotary units 38A, 40A move into and out of engagement with their respective IC wafer 26, 28, the IC wafers only need to be moved in the X and Y directions to align the chips of the wafer, and preferably the good chips only, with the pick-and-place heads 50, 52 of the rotary units. That is, the first and second positioning units 34A, 36A do not need to move the IC wafers in the Z-direction into and out of engagement with the rotary units, but instead only need to move the wafers in the X and Y directions so that their respective rotary unit can pick up the available good chips. Accordingly, except for the manner in which the IC wafers and rotary units move into and out of engagement with each other, the rotary chip attach stations 20 of FIG. 2 and 80 of FIG. 3 operate in substantially the same manner.

Referring to the preferred embodiments exemplified in FIGS. 2 and 3, the rotary units 38, 38A, 40, 40A grab and hold the chips 50, 52 with suction and release the chips by interrupting or blocking the suction. While not being limited to a particular theory, there are various approaches for intermediately turning suction on and off at the pick-and-place heads 50, 52 as the heads rotate around the circumference of the rotary units. For example, each rotary unit includes an exclusive air channel or contact extending inwardly from the heads 50, 52 to an inner opening periodically in communication with a vacuum. The vacuum is preferably stationary and abuts each rotary unit while allowing each rotary unit to rotate, preferably in-step, as described above. The vacuum communicates with the inner openings of the air channels to pull air from the atmosphere outside the rotary unit into the air channels within the rotary unit and create suction at the pick-and-place heads 50, 52. That is, when the inner opening of the air channel for each head is in gaseous communication with the vacuum, the vacuum pulls air through the air channel and creates suction at the associated pick-and-place head that enables the head to pick up a chip. The vacuum is adapted to communicate with the inner openings from a time before each head 50, 52 is about to pick one of the chips 22, 24 to just before the chip is placed onto the substrate. In other words, the vacuum communicates with the inner openings while suction is desired at the respective head 50, 52, for example, from before a chip is picked from an IC wafer through when the chip is transferred to adjacent the substrate and the chip is placed on the substrate. The communication between the vacuum and each pick-and-place head 50, 52 (via the air channels) is interrupted as the chip is adjacent the substrate to release the suctional hold of the chip and thus release the chip onto the substrate.

While not being limited to a particular theory, the rotary units preferably have a sprocket wheel shape with an odd number of generally evenly spaced outer tips, and each outer tip including one of the pick-and-place heads 50, 52. In this manner, the rotary units can rotate in step to stop when each head is positioned to grab a chip 22, 24, from its membrane 42, 44; and to move as each head places its grabbed chip onto the moving substrate. Preferably the rotary units move at a speed that allows the grabbed chips to move at about the speed of the substrate 30 for optimal placement of each chip onto the substrate moving at about the same speed.

Figure 4:
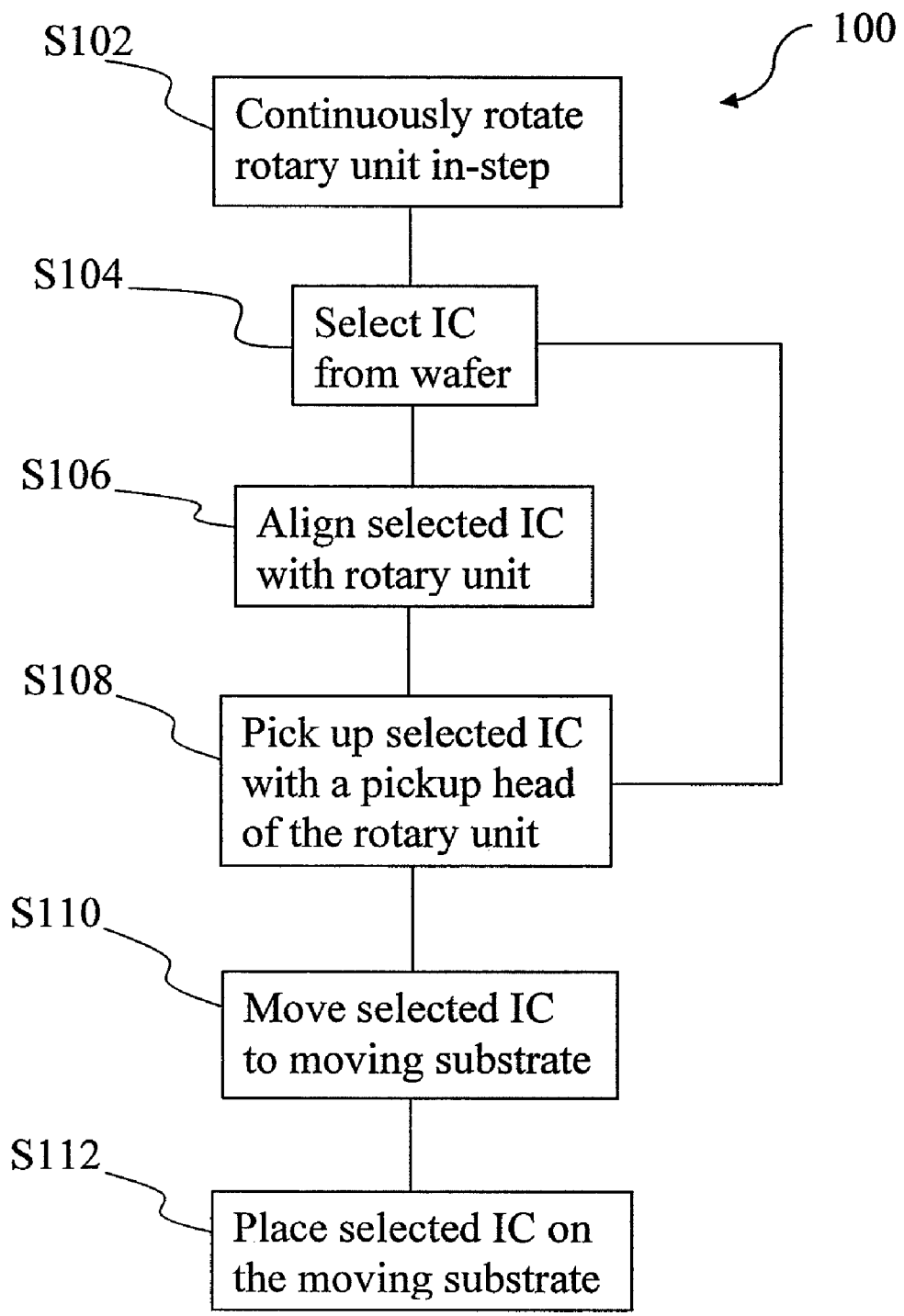
FIG. 4 is a full chart illustrating an exemplary method of the preferred embodiments.

FIG. 4 is a flow diagram illustrating an exemplary process 100 for taking chips directly from a wafer to a substrate in a rotary process. At step S102, a rotary unit is continuously rotated in-step, preferably with the help of a stepping motor. At step S104, chips or ICs preferably located on an IC wafer are selected for placement onto a substrate. The chips may be selected in any manner known to a person of ordinary skill in the art, for example, based on results from a testing and vision system that determines which of the chips on an IC wafer are good or bad; or less preferably, by just selecting each chip of an IC wafer. At step S106, the selected chip is aligned with a rotary unit. A preferred approach for aligning the selected chip with the rotary unit is with use of a positioning unit having a support member that holds the IC wafer and moves the wafer in at least the X and Y directions such that the selected chip is aligned with a pick-and-place head of the rotary unit.

At step S108, the rotary unit picks up the selected IC. In order to pick up the selected IC, the IC wafer and rotary unit are placed adjacent to each other so that a pick up member (e.g., pick-and-place head) of the rotary unit can pierce the membrane of the IC wafer, if needed, and pick (e.g., grab, suck) the selected chip from the IC wafer. The pick up member then removes the selected chip from the IC wafer and moves the selected chip to the continuously moving substrate, at step S110. The rotary unit and IC wafer move into and out of engagement with each other preferably with either the rotary unit or the IC wafer shifting toward the other for engagement, and moving away from each other for unobstructed rotation of the rotary unit under the wafer.

Preferably, the rotary unit rotates in-step to move the selected IC about the circumference of the rotary unit until it is located adjacent the substrate. At step S112, the selected IC is placed onto the continuously moving substrate. Preferably, the selected IC is placed on the substrate by releasing the hold of the chip, for example, by shutting off the suction of the pick up member (e.g., pick-and-place head) or otherwise releasing the grasp of the chip. While not being limited to a particular theory, during the step, the rotary unit is moving between its periodic stops preferably at a speed that matches the speed of the continuously moving substrate. That is, while moving, the speed at the circumference of the rotary units is about the same as the in-line speed of the continuously moving substrate. This allows the selected chip to be placed onto the substrate at matching speeds, which allows for precise placement of the chip onto the substrate. Since the chips are moving at the speed of the web when placed on the web, the placed chips do not slip on the web during placement. This process 100 is repeated for subsequently selected chips and, preferably for a plurality of rotary units placed in line to increase throughput.

It is understood that the rotary chip attach method and apparatus described and shown are exemplary indications of preferred embodiments of the invention, and are given by way of illustration only. In other words, the concept of the present invention may be readily applied to a variety of preferred embodiments, including those disclosed herein. While the invention has been described in detail and with reference to specific examples thereof, it will be apparent to one skilled in the art that various changes and modifications can be made therein without departing from the spirit and scope thereof. For example, some of the plurality of rotary units and corresponding IC wafers may be used in-line and others of the plurality of rotary units and IC wafers be placed next to each other to deposit a greater number of chips onto a substrate in rows and columns for greater throughput. Moreover, the IC wafers may be used in a configuration upside down from the IC wafers shown in the figures, such that the ICs hang from the membrane instead of sit atop the membrane. In this alternative configuration the pick-and-place heads would not need to pierce the membrane in order to grab and pull the chips from the wafer. Further, the process may include aligning conductive contact portions of the selected integrated circuit with a conductive strip 54 on the substrate, and placing the conductive contact portions into conductive communication with the conductive strip as the substrate moves in the first direction, as readily understood by a skilled artisan. Still further, the process may include creating a conductive gap in the conductive strip 54 between the conductive contact portions of the selected integrated circuit. Yet still further, the process may include bonding the conductive contact portions of the selected integrated circuit to the conductive strip. Without further elaboration, the foregoing will so fully illustrate the invention that others may, by applying current or future knowledge, readily adapt the same for use under various conditions of service.

What is claimed is:

1. A method for transferring integrated circuits to a substrate moving in a first direction, the method comprising:
   (a) continuously rotating a rotary unit in-step and in a first rotational direction between a wafer bed and the substrate, the wafer bed including a membrane that supports the integrated circuits;
   (b) selecting one of the integrated circuits;
   (c) aligning the selected integrated circuit with the rotary unit having pickup members externally placed about the rotary unit;
   (d) piercing the membrane of the wafer bed adjacent the supported selected integrated circuit with one of the pickup members;
   (e) taking the selected integrated circuit from the wafer bed with the one of the pickup members through the membrane;
   (f) moving the selected integrated circuit about the rotating rotary unit in-step to the moving substrate; and
   (g) placing the selected integrated circuit on the substrate moving in the first direction.

2. The method of claim 1, further comprising mapping the integrated circuits on the wafer bed as one of desired integrated circuits and unwanted integrated circuits, and wherein-step (b) includes selecting one of the desired integrated circuits only.

3. The method of claim 1, further comprising continuously moving the substrate in the first direction while the selected integrated circuit is placed on the substrate.

4. The method of claim 1, further comprising selecting a second one of the integrated circuits, aligning the second selected integrated circuit with the rotary unit, taking the second selected integrated circuit from the wafer bed with a second one of the pickup members, and placing the second selected integrated circuit on the substrate adjacent the placed selected integrated circuit.

5. The method of claim 1, wherein step (a) includes rotating the rotary unit in-step between the wafer bed and the substrate.

6. The method of claim 1, further comprising:
   before step (d), shifting the wafer bed towards the rotary unit, and
   after step (e), shifting the wafer bed away from the rotary unit.

7. The method of claim 1, further comprising:
   before step (d), shifting the rotary unit towards the wafer bed, and
   after step (e), shifting the rotary unit away from the wafer bed.

8. The method of claim 1, the wafer bed being a first wafer bed, and further comprising:
   continuously rotating a second rotary unit in-step between a second wafer bed and the substrate, the second wafer bed including a membrane that supports the integrated circuits;
   selecting an integrated circuit from the second wafer bed;
   aligning the selected integrated circuit from the second wafer bed with the second rotary unit having pickup members externally placed about the second rotary unit;
   taking the selected integrated circuit from the second wafer bed with one of the pickup members from the second rotary unit by piercing the membrane of the second wafer bed adjacent the selected integrated circuit of the second wafer bed with the pickup members and grabbing the selected integrated circuit;
   moving the selected integrated circuit from the second wafer bed about the second rotary unit to the moving substrate; and
   placing the selected integrated circuit from the second wafer bed on the substrate adjacent and in alignment with the selected integrated circuit from the first wafer bed.

9. The method of claim 8, further comprising continuously moving the substrate in the first direction while the selected integrated circuits are placed on the substrate.

10. The method of claim 8, further comprising alternatively placing desired integrated circuits from the first wafer bed and the second wafer bed on the moving substrate.

11. The method of claim 1, wherein step (a) further comprises rotating the rotary unit unidirectionally.

* * * * *